(12) United States Patent
Hsiung

(10) Patent No.: US 7,564,692 B2
(45) Date of Patent: Jul. 21, 2009

(54) RETAINING STRUCTURE FOR MOUNTING TWO INDEPENDENT COMPUTERS WITHIN ONE STANDARD SLOT IN A COMPUTER CABINET

(76) Inventor: William Tse Lin Hsiung, 235 Chung - Ho Box 8-24, Taipei (TW)

( * ) Notice: Subject to any disclaimer, the term of this patent is extended or adjusted under 35 U.S.C. 154(b) by 260 days.

(21) Appl. No.: 11/542,908

(22) Filed: Oct. 5, 2006

(65) Prior Publication Data

US 2008/0084673 A1    Apr. 10, 2008

(51) Int. Cl.
*H05K 5/00* (2006.01)
*H05K 7/16* (2006.01)

(52) U.S. Cl. .................. 361/730; 361/724; 361/725; 361/727

(58) Field of Classification Search .............. 361/724, 361/725, 729, 735, 730, 727
See application file for complete search history.

(56) References Cited

U.S. PATENT DOCUMENTS

| | | | | |
|---|---|---|---|---|
| 3,959,995 A * | 6/1976 | Fletcher | ........................... | 70/18 |
| 4,660,125 A * | 4/1987 | Purdy et al. | .................. | 361/727 |
| 5,076,531 A * | 12/1991 | Delaney | ..................... | 248/552 |
| 6,012,739 A * | 1/2000 | Weiss et al. | .................. | 280/814 |
| 6,021,047 A * | 2/2000 | Lopez et al. | ................. | 361/727 |
| 6,026,089 A * | 2/2000 | Benayoun et al. | ...... | 340/286.01 |
| 6,142,590 A * | 11/2000 | Harwell | .................... | 312/223.1 |
| 6,201,690 B1 * | 3/2001 | Moore et al. | ................. | 361/683 |
| 6,320,749 B1 * | 11/2001 | Ayres et al. | .................. | 361/730 |
| 6,392,884 B1 * | 5/2002 | Chou | .......................... | 361/687 |
| 6,481,809 B1 * | 11/2002 | Richardson | .............. | 312/223.2 |
| 6,496,364 B1 * | 12/2002 | Medin et al. | ................. | 361/686 |
| 6,525,926 B1 * | 2/2003 | Chen | .......................... | 361/683 |
| 6,583,989 B1 * | 6/2003 | Guyer et al. | ................. | 361/724 |
| 6,611,432 B2 * | 8/2003 | Blood | ......................... | 361/724 |
| 6,667,891 B2 * | 12/2003 | Coglitore et al. | ............ | 361/796 |
| 6,693,797 B2 * | 2/2004 | Faneuf et al. | ................. | 361/689 |
| 6,741,463 B1 * | 5/2004 | Akhtar et al. | ................. | 361/686 |
| 6,924,989 B2 * | 8/2005 | Hall | ............................ | 361/826 |
| 6,958,906 B2 * | 10/2005 | Wu et al. | ...................... | 361/687 |
| 6,975,510 B1 * | 12/2005 | Robbins et al. | ............. | 361/695 |
| 7,016,191 B2 * | 3/2006 | Miyamoto et al. | ........... | 361/687 |
| 2003/0112596 A1 * | 6/2003 | Shih | ............................ | 361/685 |

* cited by examiner

*Primary Examiner*—Anatoly Vortman
*Assistant Examiner*—Quinn Hunter

(57) ABSTRACT

A retaining structure mounts two independent computers within one standard slot of height 1 U in a computer cabinet. The computer units are arranged in parallel, with a total front width fitting the standard computer cabinet of industrial use. The two computers can be of equal size or of different sizes. Depending on the electric connections, they can operate independently or dependently, following a mater/slave relation. Further, there is a foldable U-shaped bracket mounted on an inner wall of the cabinet for retaining the computers and capable of being folded about pivotal axes on the arms of the bracket.

6 Claims, 10 Drawing Sheets

RETAINING STRUCTURE FOR MOUNTING TWO INDEPENDENT COMPUTERS WITHIN ONE STANDARD SLOT IN A COMPUTER CABINET

FIELD OF THE INVENTION

The present invention relates to computer cabinets for industrial use, more particularly to a retaining structure for mounting two independent computers within one standard slot in a computer cabinet. Two computer units are arranged in parallel with 1 U (1 U=4.445 CM) height and combined width less than 19 inches. The bracket for retaining the computers is foldable, so that it can be folded to retain a single computer therein.

BACKGROUND OF THE INVENTION

The computer cabinets provided by ISP, net communication and multimedia service companies are disposed in a properly controlled internal space, called computer room, whereby the computers will be operating without interruptions. Therefore, the temperature, humidity, and airflow should be stably maintained, and the running cost for such a computer room is high. It is obvious that the more the computers allowed in a fixed space, the lower the running cost is.

Referring to FIG. 1, a computer cabinet 10 of the prior art is connected with a computer unit 20. A standard slot of the computer cabinet 10 has a height of 1 U and a front width of 19 inches and can house only one computer/server unit 12. It a multiple of computers are needed to use at the same time, each of the computers has to occupy a slot till the cabinet is full.

The computer cabinet disclosed in R.O.C. patent number 547687 mentioned a solution to the problem of insufficient storage space. The invention comprises a main cabinet with slots lower than 2 U and an expandable cabinet; those cabinets are connected by an internal insertion port in the main cabinet and a connection slot on the expandable cabinet, whereby the main boards of the computer can be electrically connected to the interface. Therefore, the height of the computer cabinets are reduced, and the space is more efficiently used.

From another view, since small companies cannot afford owning their own computer rooms, they need to rent computer space from providers for their IT instruments; if the running cost of a computer room can be reduced, the rental rate paid by the small companies can also be economized. Therefore, saving the storage space of computer units is profound to the business world.

SUMMARY OF THE INVENTION

The primary objective of the present invention is to provide a retaining structure for mounting two independent computers within one standard slot in a computer cabinet. Two computer units are arranged in parallel with 1 U (1 U=4.445 CM) height and combined front width less than 19 inches. The front width of the two computers should satisfies the industrial standard, and therefore they can be a combination of a large one and a small one or two of equal size. Depending on electric connectivity, the computers can work independently or in master/slave relation.

By the same token, the present invention can be used in slots of 2 U, 4 U or other multiples of U in a computer cabinet, whereby the computing power or storage function will be enhanced.

The secondary objective of the present invention is to provide a retaining structure for mounting two independent computers within one standard slot in a computer cabinet, whereby extra space in a computer room is not necessary even the number of computer modules is increased significantly. Therefore, the present invention can save space, lower the running cost of a computer room and minimize the space requirement of a computer room.

It is a further objective of the present invention that the present invention provides a foldable U-shaped bracket for retaining two independent computers. The bracket is attached on an inner lateral side of a standard 19-inch slot, on which computers are mounted by screwing mechanisms. Further, there are sliding mechanisms facilitating the installation of computers in the cabinet such as slide rails and grooves.

The computers retained by the foldable U-shaped bracket can be detached easily for maintenance, without interrupting the operation of another computer in the same bracket. The technology of "hot swap" can also be applied in the present invention.

Accordingly, the present invention comprise a cabinet with at least one standard 19-inch wide slot and sufficient room for housing two computer units of 1 U height. Each of the computer units at least comprises a data storage unit, a main board and input/output ports. The input/output ports appear in the front panel of the computer unit, which can be USB or 1394 slots. The rear end of the computer is provided with signal terminals. The computer unit is further provided with independent power supply.

The two computer units sharing the same retaining structure can be the same of different; they also can be operated independently or dependently (say, having a mater/slave relation).

A present invention further includes a foldable U-shaped bracket attached on an outer lateral wall of the computer units. The computer and the attached bracket are mounted on an inner lateral wall of the cabinet. Two arms of the bracket are respectively provided with pivotal axes for shrinking the bracket when a computer is not installed. The front panel of the bracket is provided with two windows and a plurality of through holes for exposing the display panels of the computers.

The various objects and advantages of the present invention will be more readily understood from the following detailed description when read in conjunction with the appended drawings.

DETAILED DESCRIPTION OF THE PREFERRED EMBODIMENTS

Figure 1:
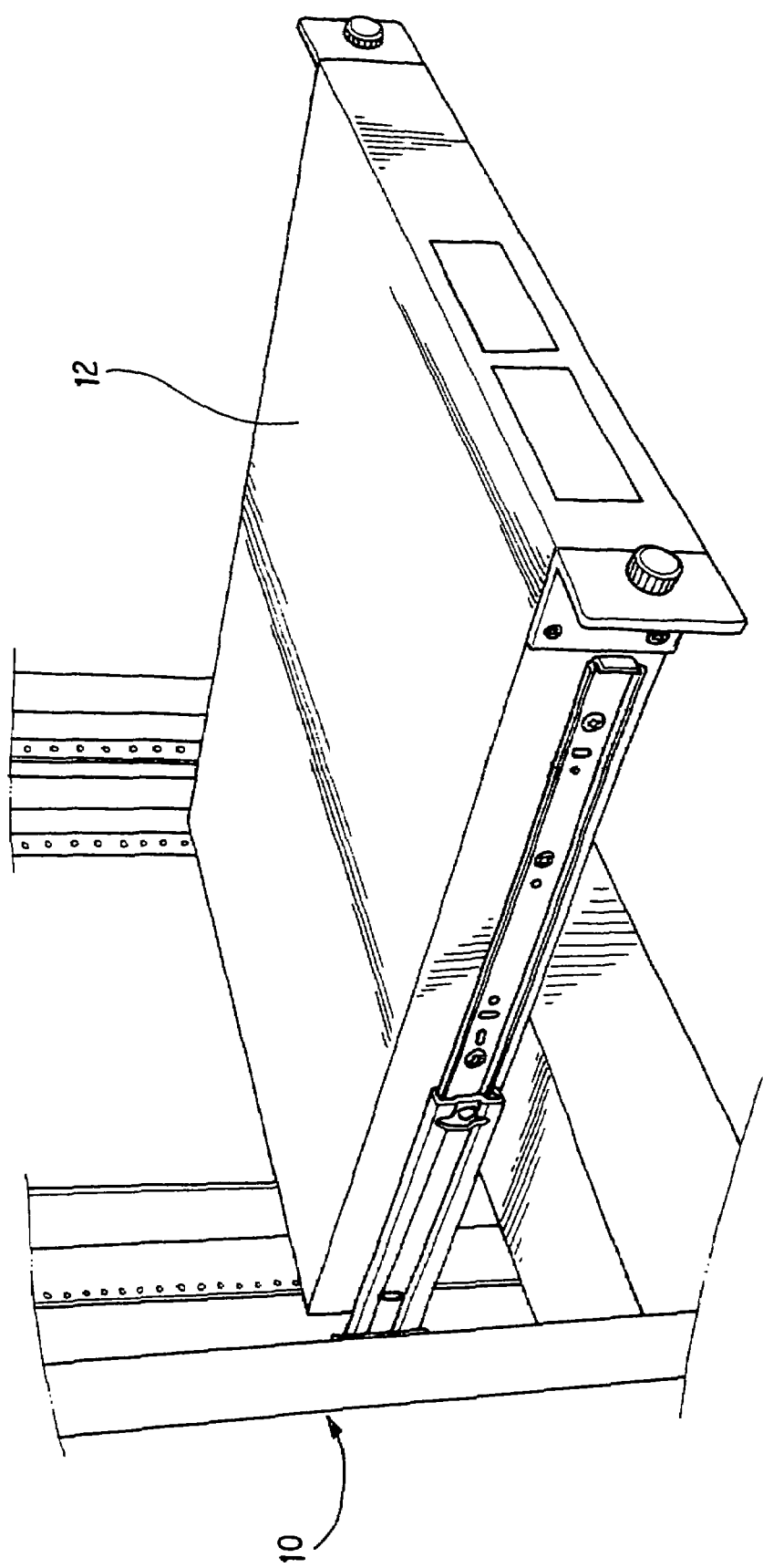
FIG. 1 is a perspective view of a computer unit mounted on a computer cabinet of the prior art.
Figure 2:
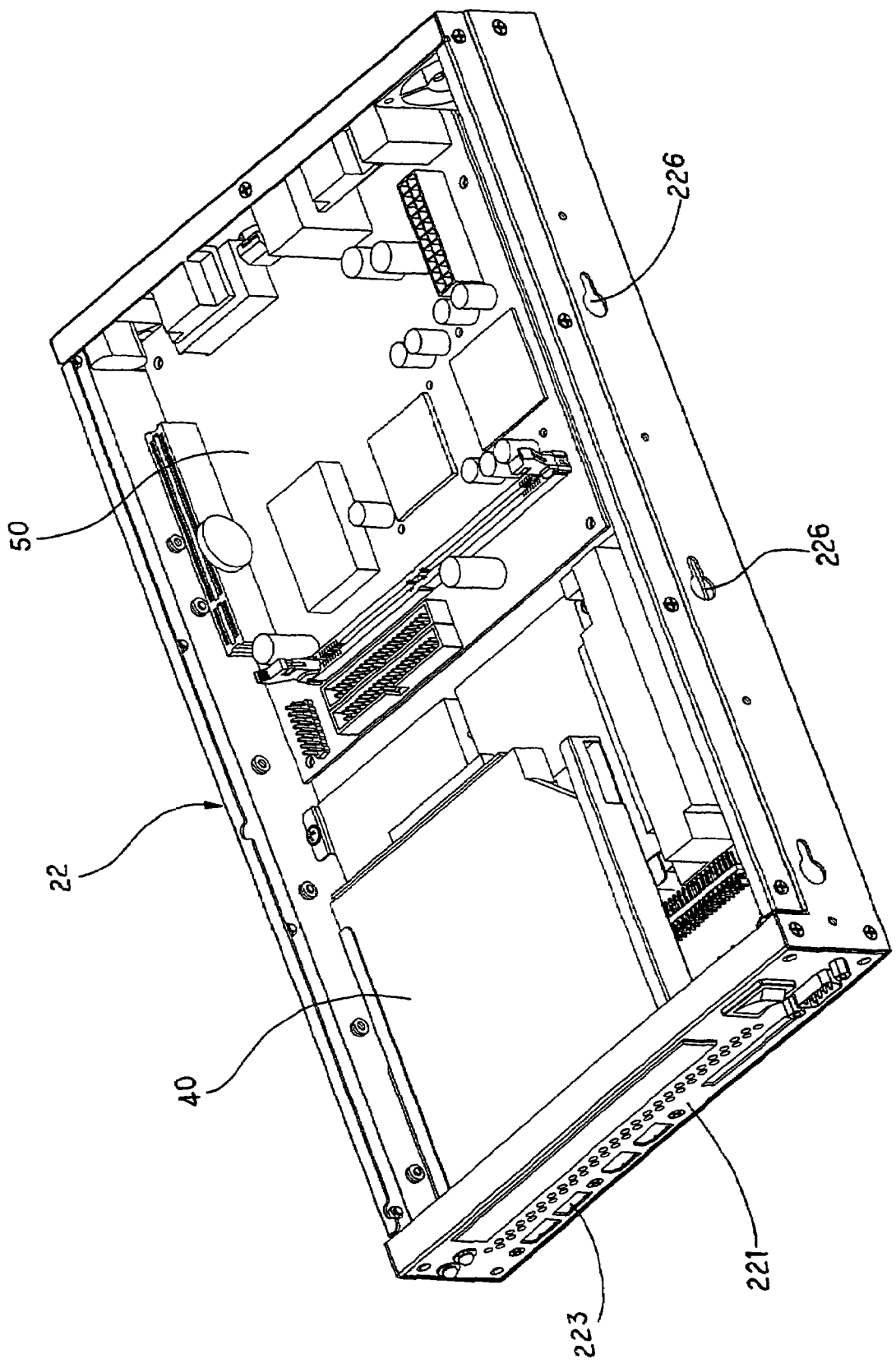
FIG. 2 is an internal view an independent computer unit.
Figure 3:
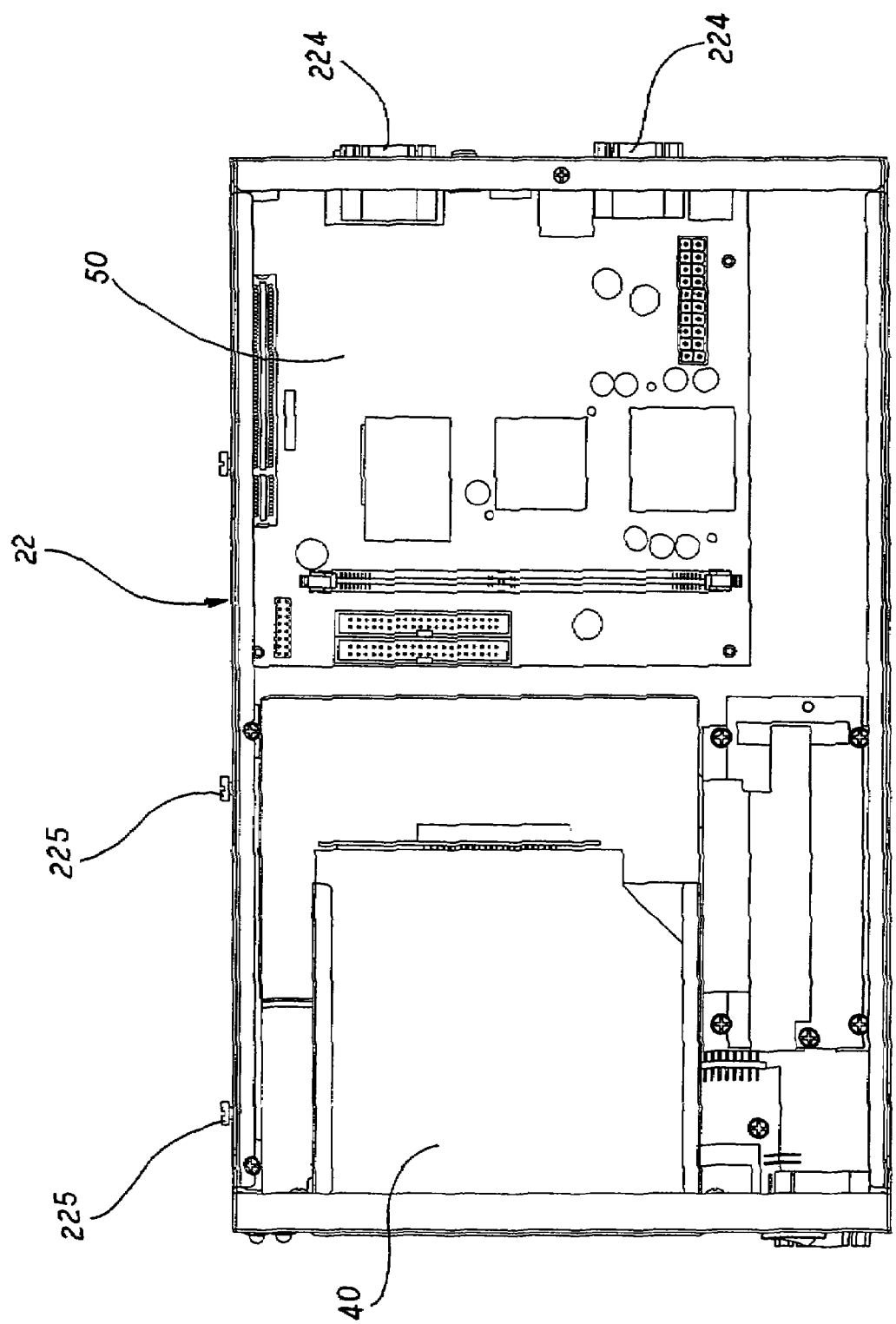
FIG. 3 is a top view of an independent computer unit.

The height of standard slots in a computer cabinet is units of U (1 U=4.445 CM). Computer units suitable for standard cabinet have a height selected from 1, 2 and 4 U. In the first preferred embodiment, the computer height is 1 U; but the present invention may apply to 2 and 4 U. Referring to FIGS. 2 and 3, a computer unit 22 of height 1 U comprises a data access device 40 (CD-R, HDD, DVD-R or CARD READER), a mother board 50 and an input/output port. The input/output port further includes a plurality of slots 223 (USB and/or 1394 specification) on the front panel 221 of the computer unit 22, a plurality of signal terminals 224 and an independent power supply (not shown in the figures). It is worth mentioning that the mother board 50 is a Mini-ITX mother board, which has the advantages of high performance, saving energy, low heat generation, expendability and compactness. The width of the computer unit 22 is a half of the standard 19-inch width, so that one regular slot of a cabinet can store two. It can also be a combination of one large computer and one small computer, whose total width fits 19 inches. The lateral sides of the computer unit 22 respectively include at least a cogged joint 225 and a joint hole 226 for retaining two computer nits together. The computer unit 22 can also be of height 2 U or 4 U.

Figure 4:
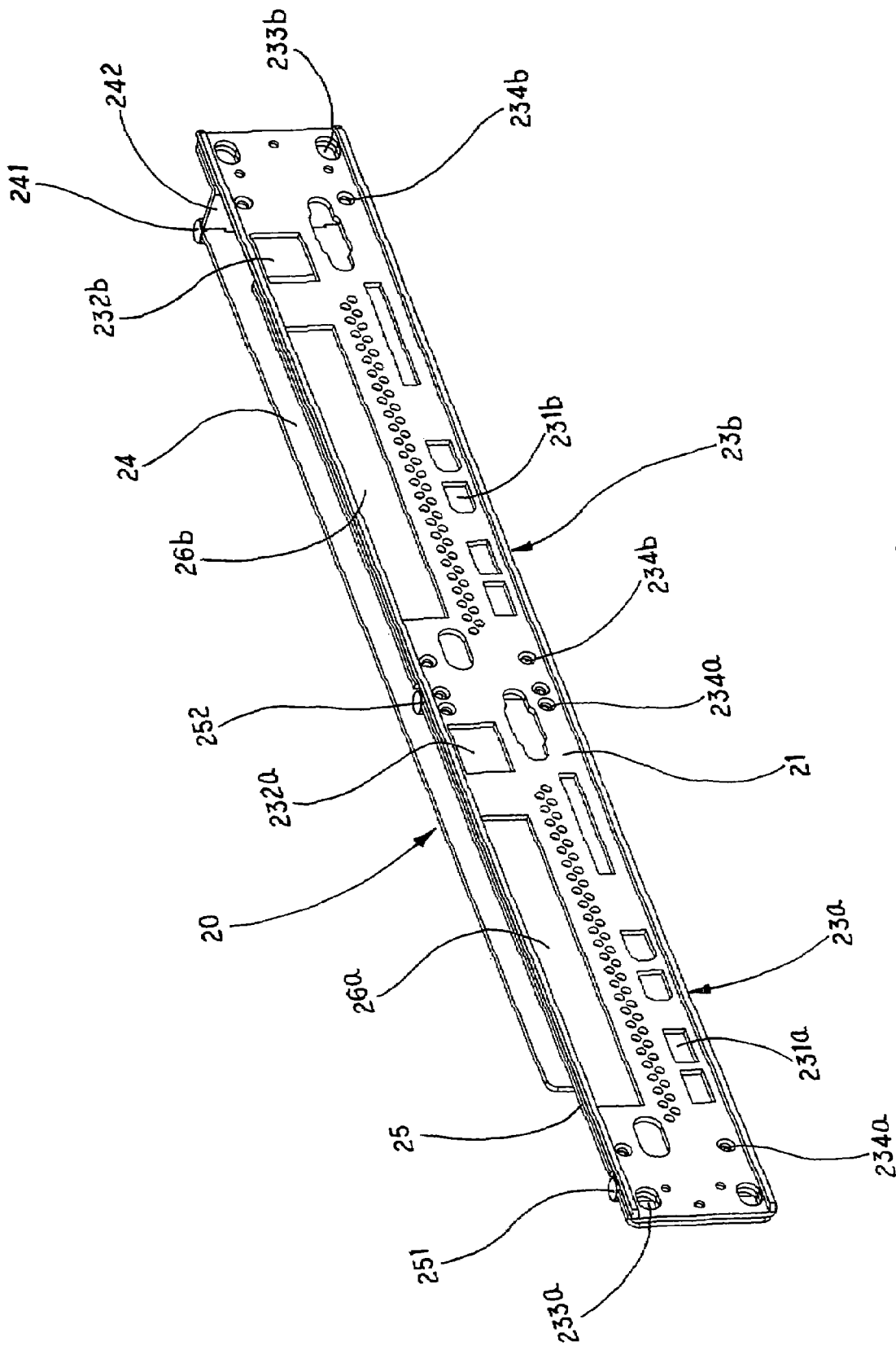
FIG. 4 shows the foldable U-shaped bracket of the present invention in the folded configuration.
Figure 4A:
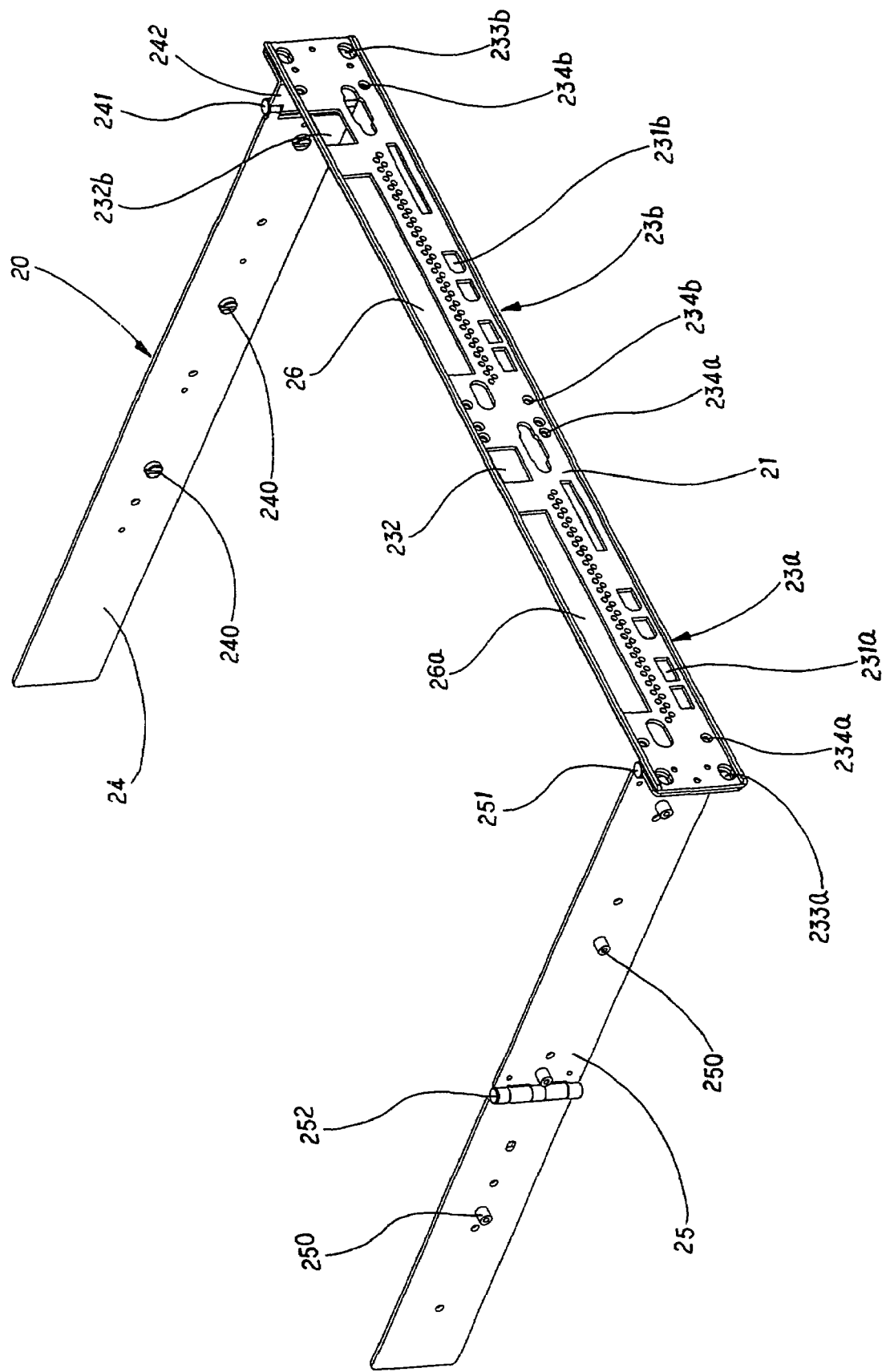
FIG. 4A shows the foldable U-shaped bracket of the present invention in the stretched configuration.

A retaining structure for mounting two independent computers within one standard slot in a computer cabinet according to the present invention is a U-shaped bracket 20 comprising a front panel 21, a first arm 24 and a second arm 25. The two arms are attached on two outer lateral sides of a module of two combined computer units, as shown in FIGS. 4 and 4A. The bracket 20 can be folded (FIG. 4) and stretched (FIG. 4A) and has the front panel 21 with two windows 26a, 26b for exposing the front panels and front slots of the computers and a plurality of through holes 23a and 23b for the assess to the USB or 1394 signal terminals (231a, 231b) and the buttons of the computer units (232a, 232b). The front panel 21 further includes through holes 233a, 233b for locking the cabinet and through holes 234a, 234b for locking the computer units.

The first arm 24 of the U-shaped bracket 20 further comprises a plurality of projected pieces 240 corresponding to the joint holes 226 of one of the computer units 22 and a pivot 241 formed on the front end of the first arm 24 close to the front panel 21. The second arm 25 further comprises a plurality of projected pieces 250 corresponding to the joint holes 226 of a computer units, a first pivot 251 formed on the front end of the first arm 24 close to the front panel 21 and a second pivot 252 near the center of the second arm 25. Therefore, the second arm 25 is a two-section plate. Between the pivot 241 and the front panel 21, there is a short section 242, whereby there will be a housing space for the second arm 25 as the first arm 24 is folded. Therefore, the bracket 20 can be folded for delivery.

Figure 5:
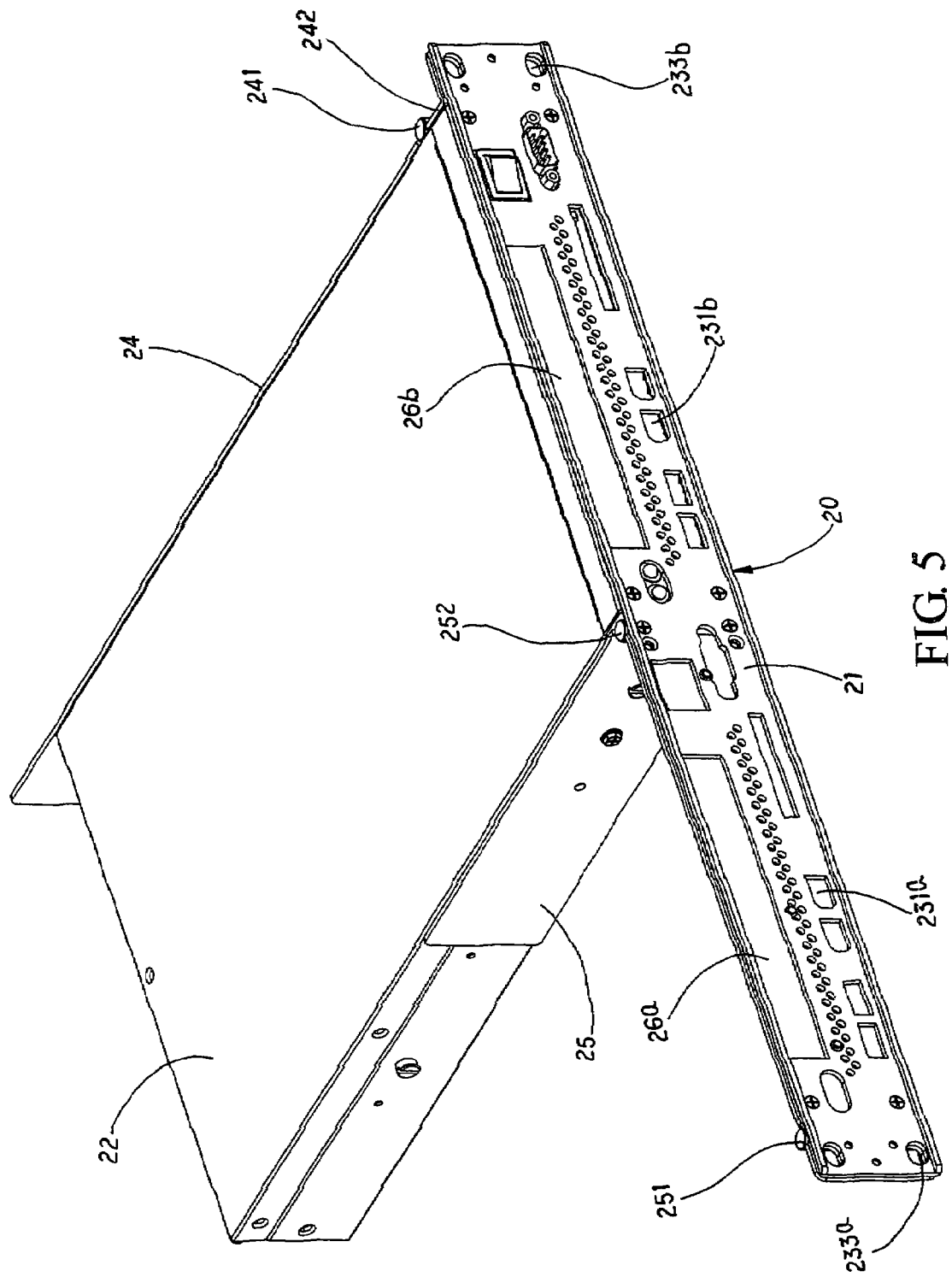
FIG. 5 shows the foldable U-shaped bracket of the present invention in the half-folded configuration, with a computer unit installed.
Figure 6:
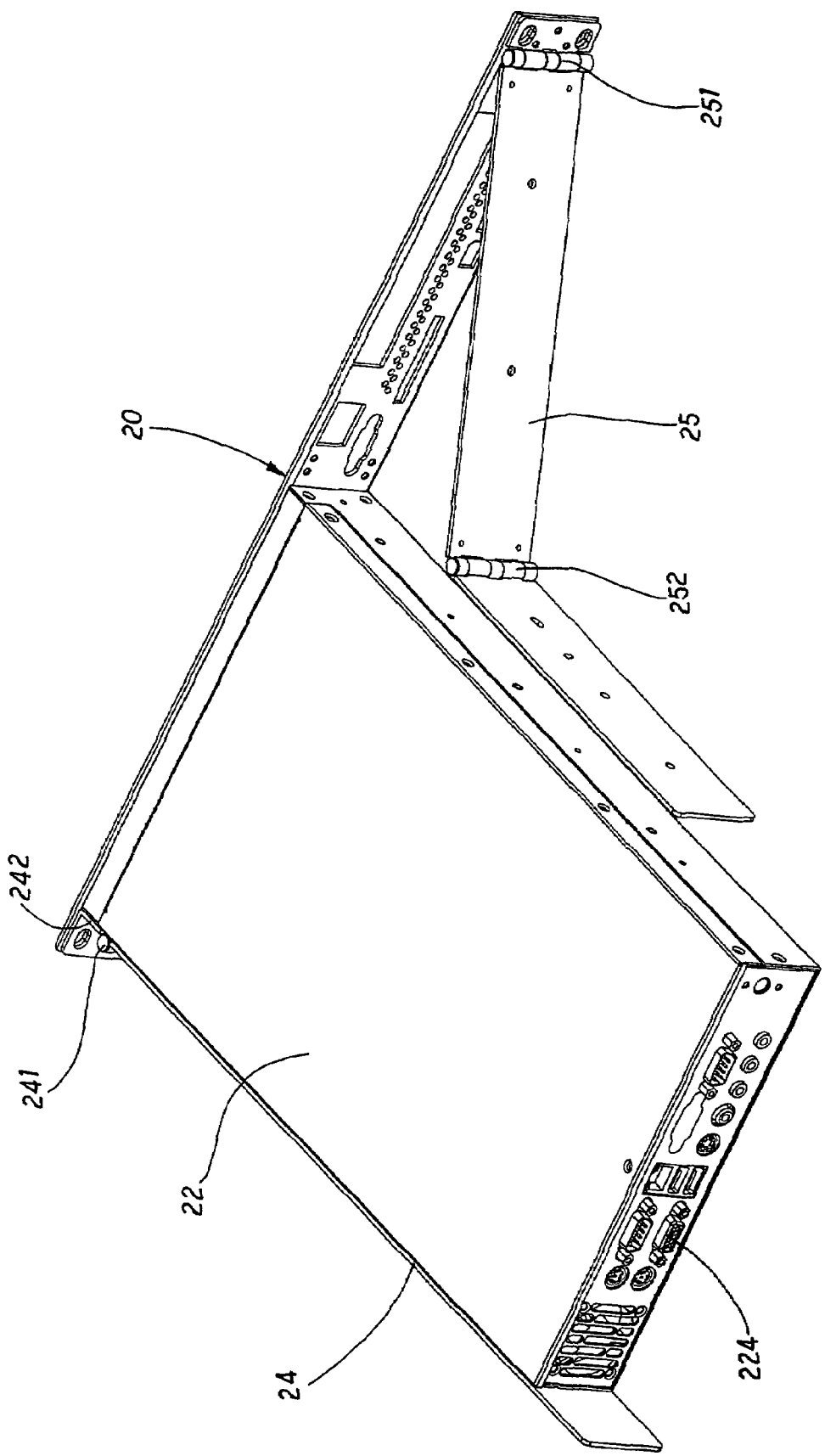
FIG. 6 is another perspective view of the foldable U-shaped bracket in FIG. 5.

FIGS. 5 and 6 show configuration of the bracket 20, wherein one computer unit 22 is retained. One lateral side of the computer unit 22 is attached with the first arm 24 of the bracket 20, after the arm 24 is opened about the pivot 241, and brought in contact with the inner wall of the front panel 21. The computer unit 22 is then locked to the bracket 20. The second arm 25 is folded in half about the second pivot 252 so that the end section of the arm 25 is attached on the opposite lateral side of the computer unit 22, whereby the installation of the computer unit 22 is accomplished. A second computer unit can be added without interrupted the operation of the first computer unit 22 by folding the second arm 25 in the full stretched state. Either one of the computer units can be taken out for maintenance, following the flexibility of "HOT SWAP".

Figure 7:
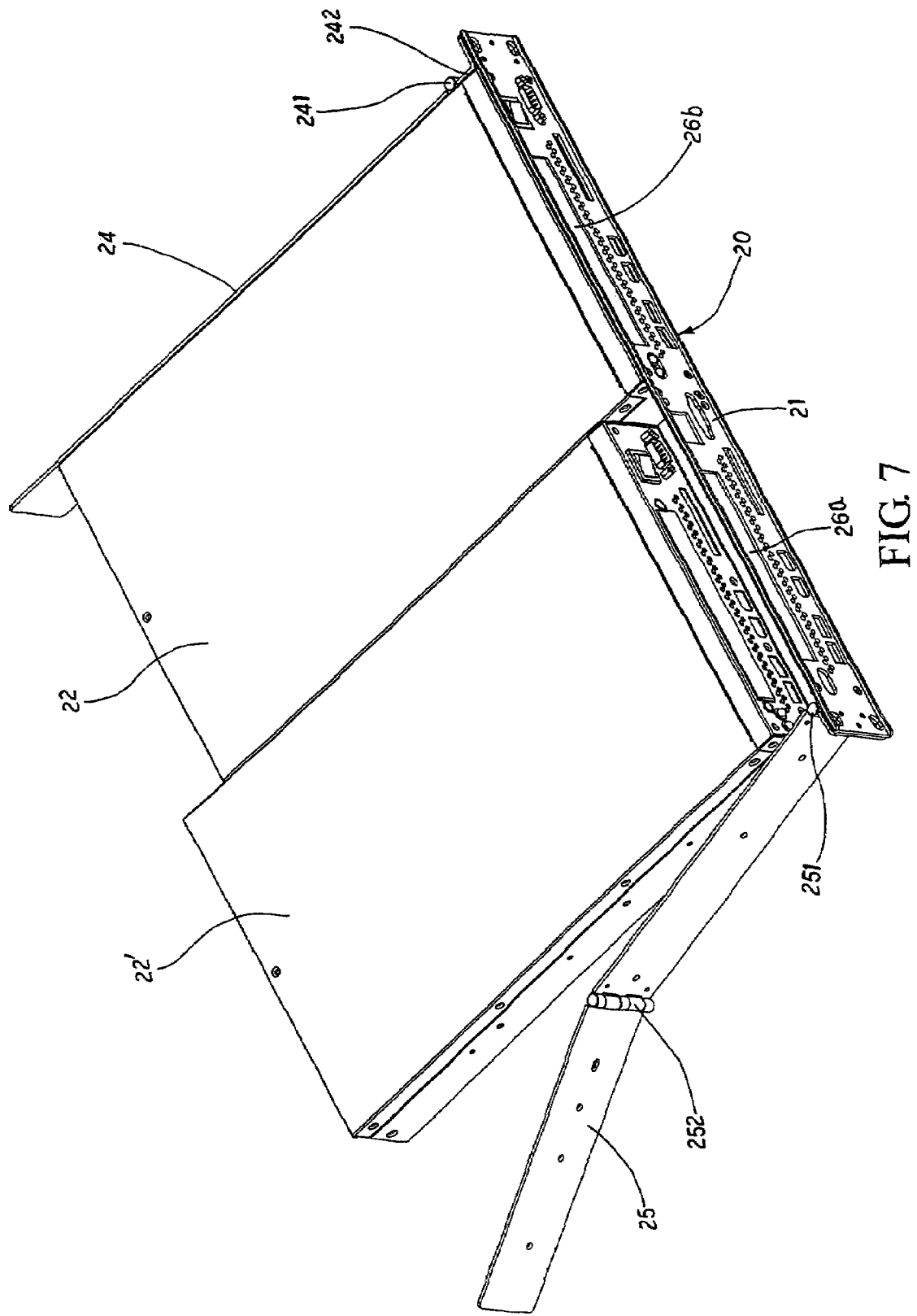
FIG. 7 is a perspective view of the foldable U-shaped bracket of the present invention with two independent computer units retained therein.

Referring to FIG. 7, the bracket 20 retains two computer units 22, 22' within one standard slot of height 1 U in a computer cabinet. The computer units 22, 22' are arranged in parallel, with a total front width fitting the standard computer cabinet of industrial use, namely 19 inches. The two computer units 22, 22' are equal size. As illustrated in the last two figures, two arms 24, 25 are fully stretched to respectively embrace out lateral side of the combined module of computer. Depending on the electric connection, they can operate independently or dependently, following a mater/slave relation. Further, there is a foldable U-shaped bracket mounted on an inner wall of the cabinet for retaining the computers and capable of being folded about pivotal axes on the arms of the bracket. The front panel 21 of the bracket 20 is provided with two windows 26a, 26b and a plurality of through holes 23a, 23b for exposing the display panels of the computers.

Figure 8:
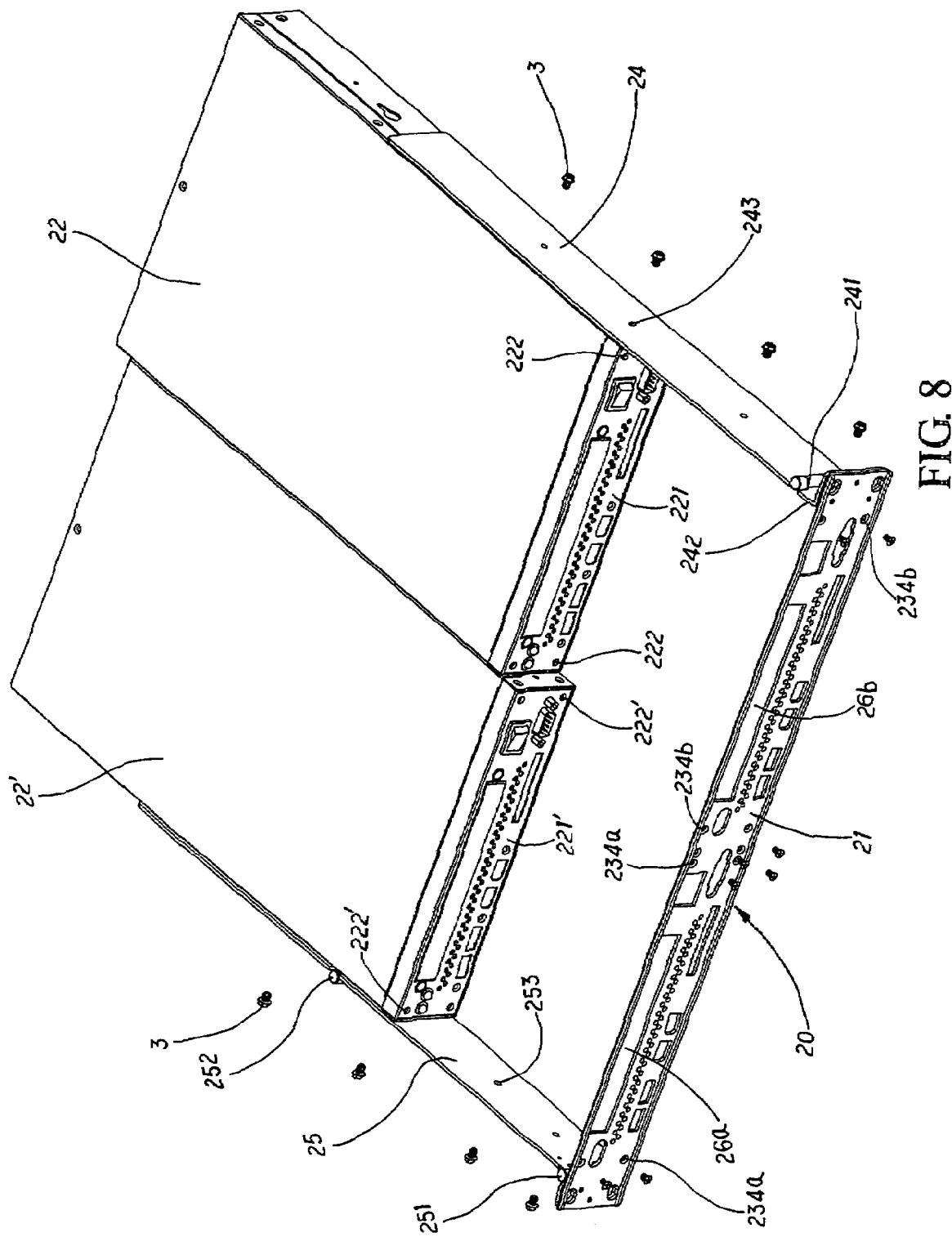
FIG. 8 shows the foldable U-shaped bracket of the present invention in the process of locking two independent computer units.
Figure 9:
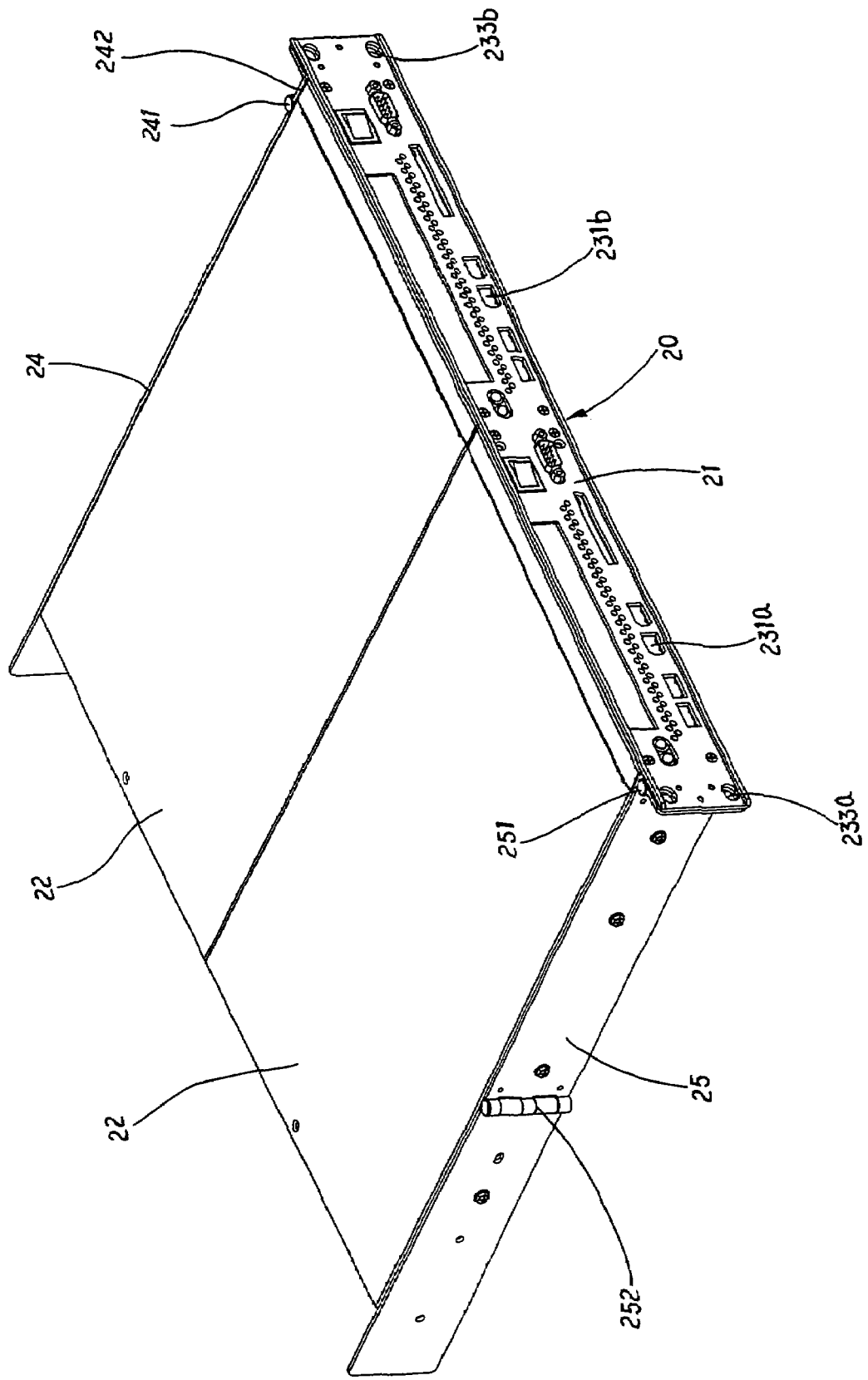
FIG. 9 is another perspective view of the foldable U-shaped bracket of the present invention with two independent computer units retained therein.

Referring to FIG. 8, the facing lateral walls of the computer units 22, 22' are respectively provided with cogged joints and joint holes (shown in FIGS. 2 and 3), which are complementary with each other. Other mechanisms for locking the computer units 22, 22' are in the scope of the present invention. Further, the projected pieces 240, 250 on the first arm 24 and the second arm 25 can be coupled with the joint holes 226 and the through holes 243, 253 are overlapped with the through hole 234a, 234b on the front panel 21, whereby the screw holes 222, 222' on the panels 221, 221' are overlapped with corresponding lateral walls of the computer units 22, 22'. A plurality of screw parts 3 are then used to secure the computer units 22, 22' in the bracket 20. As shown in FIG. 9, the combined structure of computers and bracket is mounted within a computer cabinet by slide rails or other movable retaining mechanisms.

The present invention is thus described, and it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A retaining structure for mounting two independent computers within one standard slot in a computer cabinet, comprising:

a cabinet with at least an opening of a standard 19-inch width for housing a computer module therein;

a retaining structure for retaining two independently operating computer units arranged in parallel;

the retaining structure for mounting two independent computers within one standard slot in a computer cabinet being a U-shaped bracket (20) comprising a front panel (21), a first arm (24) and a second arm (25); the two arms (24), (25) being attached on two outer lateral sides of a module having two combined computer units;

the bracket (20) being foldable and having the front panel (21) with two windows (26a, 26b) for exposing front panels and front slots of the computers and a plurality of through holes (23a) and (23b) for accessing USB or (1394) signal terminals (231a, 231b) and buttons of the computer units (232a, 232b); the front panel (21) further including through holes (233a, 233b) for locking the cabinet and through holes (234a, 234b) for locking the computer units; the two windows (26a, 26b) having approximately identical sizes;

the first arm (24) of the U-shaped bracket (20) comprising a plurality of projected pieces (240) corresponding to joint holes (226) of one of the computer units (22) and a pivot (241) formed on the front end of the first arm (24) close to the front panel (21);

the second arm (25) comprising a plurality of projected pieces (250) corresponding to the joint holes (226) of a computer units, a first pivot 251 formed on the front end of the first arm (24) close to the front panel (21) and a second pivot (252) near the center of the second arm (25); wherein, the second arm (25) is a two-section plate; wherein between the pivot (241) and the front panel (21), there is a short section (242); wherein the pivot (241) serves to pivotally connect the first arm (24) to the short section (242), whereby there will be a housing space for the second arm (25) as the first arm ('24) is folded; and the bracket (20) can be folded for delivery;

a pair of independently operating computer units arranged in parallel; wherein after installation of the computer units to the brackets (20), each of the two windows (26a, 26b) of the bracket (20) correspond to a font panel of a corresponding computer unit;

wherein said first arm (24) and said second arm (25) of said U-shaped will be attached onto two sidewalls of said combined computer units, and whereby said front panels of said computer units are attached on a rear wall of said front panel of said bracket.

2. The retaining structure for mounting two independent computers within one standard slot in a computer cabinet of claim 1 wherein a short plate is connected between said pivot of said first arm and said front panel, whereby there will be a housing space for said second arm as said first arm is folded.

3. The retaining structure for mounting two independent computers within one standard slot in a computer cabinet of claim 1 wherein two sidewalls of each of said computer units are respectively provided with cogged joints and joint holes for locking said computer units together.

4. The retaining structure for mounting two independent computers within one standard slot in a computer cabinet of claim 1 wherein said arms of said U-shaped bracket and said sidewalls of said computer units are further provided with overlapped though holes for screwing together.

5. The retaining structure for mounting two independent computers within one standard slot in a computer cabinet of claim 1 wherein said U-shaped bracket and said cabinet is connected by relatively movable mechanisms selected from slide rails and slide slots.

6. The retaining structure for mounting two independent computers within one standard slot in a computer cabinet of claim 1 wherein each of said computer units having at least data storage device, a mother board, an input/output port, a plurality of slots on a front panel there of and a plurality of signal terminals on a rear panel thereof.

\* \* \* \* \*